(12) United States Patent
Werdecker et al.

(10) Patent No.: US 6,381,987 B1
(45) Date of Patent: May 7, 2002

(54) PROCESS FOR MAKING OPAQUE QUARTZ GLASS AND OPAQUE COMPONENT MADE ACCORDING TO THE PROCESS

(75) Inventors: Waltraud Werdecker, Hanau; Johann Leist, Altenstadt; Heinz Fabian, Grossostheim; Rolf Göbel, Gelnhausen; Bruno Uebbing, Alzenau; Erich Rosin, Bruchköbel, all of (DE)

(73) Assignee: Heraeus Quarzglas GmbH & Co. KG, Hanau (DE)

( * ) Notice: Subject to any disclaimer, the term of this patent is extended or adjusted under 35 U.S.C. 154(b) by 0 days.

(21) Appl. No.: 09/484,103

(22) Filed: Jan. 14, 2000

(30) Foreign Application Priority Data

Dec. 22, 1999 (DE) ......................................... 199 62 452

(51) Int. Cl.⁷ ............................................... C03B 19/00
(52) U.S. Cl. ........................... 65/17.5; 65/17.3; 65/425; 65/427; 65/474
(58) Field of Search ................................. 65/17.3, 17.5, 65/417, 419, 420, 378, 416, 423, 425, 427, 474

(56) References Cited

U.S. PATENT DOCUMENTS

| | | | |
|---|---|---|---|
| 778,286 A | * 12/1904 | Thomson | ..................... 65/17.3 |
| 1,173,688 A | * 2/1916 | Thomson | ..................... 65/17.3 |
| 4,956,208 A | * 9/1990 | Uchikawa et al. | |
| 5,862,302 A | 1/1999 | Okase | |
| 5,972,488 A | * 10/1999 | Nagata et al. | |
| 6,254,940 B1 | * 7/2001 | Pratsinis et al. | |

FOREIGN PATENT DOCUMENTS

| | | |
|---|---|---|
| DE | 42 14 563 C | 2/1994 |
| DE | 44 40 104 A | 5/1995 |
| DE | 195 23 954 A | 1/1997 |
| EP | 0 715 342 A | 6/1996 |
| EP | 0 728 709 A | 8/1996 |
| EP | 0 816 297 A1 | 1/1998 |
| EP | 0 816 297 A | 1/1998 |
| EP | 0 909 743 A | 4/1999 |
| GB | 330 943 A | 6/1930 |
| GB | 2 018 743 A | 10/1979 |

OTHER PUBLICATIONS

Patent Abstracts of Japan, vol. 1998, No. 3, Feb. 27, 1998 (Feb. 7, 1998) & JP 09 301726 A (Toshiba Ceramics Co. Ltd.), Nov. 25, 1997.

Patent Abtracts of Japan, vol. 1999, No. 13, Nov. 30, 1999, & JP 11 236234 A (Tosoh Corp. et al), Aug. 31, 1999.

* cited by examiner

Primary Examiner—Michael Colaianni
(74) Attorney, Agent, or Firm—Andrew L. Tiajoloff

(57) ABSTRACT

Based on a known process for the manufacture of opaque quartz glass, by mixing $SiO_2$ particles and an additive which is volatile at a melting temperature, forming a body and melting said body with an advancing melt front forming in the body, it is proposed according to the invention that in order to reduce the danger of contamination, a body (1) be formed with an inner bore (6) and be heated in such a manner that the melt front (10) advances from the inner bore (6) to the outside. The article of pure opaque quartz glass according to the invention has high resistance to temperature change, high mechanical strength and good chemical durability. It is distinguished by an opening (6) enclosed by an inner wall (9), with an inner $SiO_2$ surface layer (15) having a layer thickness ranging from 30 mm to 500 mm and a density of at least 2.15 $g/cm^3$.

8 Claims, 1 Drawing Sheet

Figure 1:
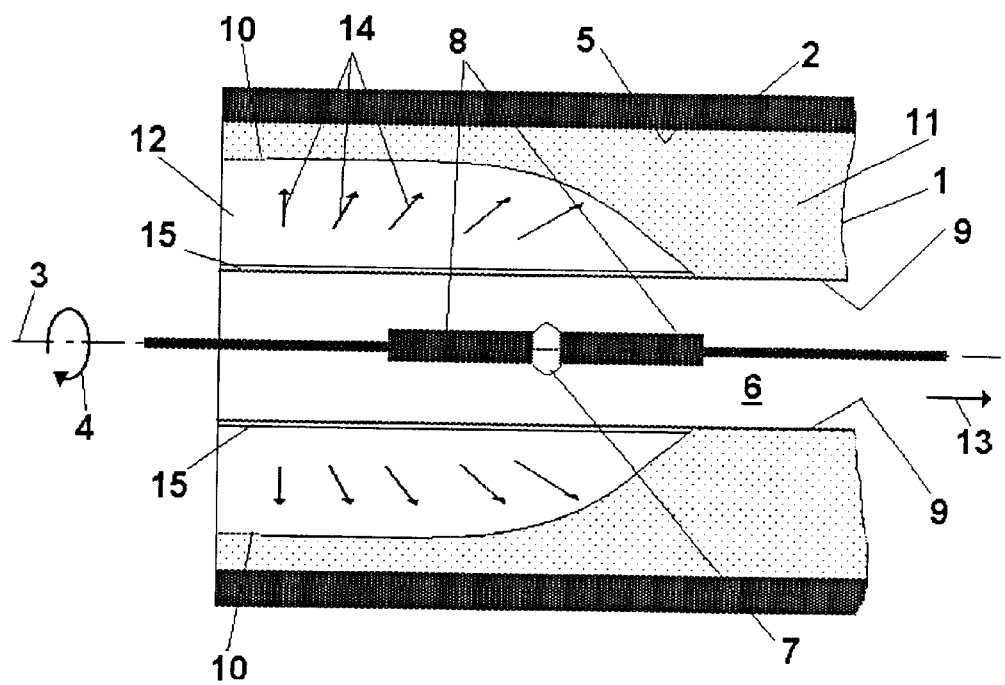

is not only kept away from the preform regions which are not yet melted; instead, the further removed from the inner bore the melted preform regions are, the lower the temperature to which they are exposed. Contaminants from the heating atmosphere and heat source are kept out of the still-porous preform regions by the gases that escape. In addition, thermal decomposition of the additive takes place better so that there are less remnants of it.

PROCESS FOR MAKING OPAQUE QUARTZ GLASS AND OPAQUE COMPONENT MADE ACCORDING TO THE PROCESS

DESCRIPTION

The invention relates to a process for producing opaque quartz glass by providing a mixture comprising $SiO_2$ particles and an additive that is volatile at a melting temperature, forming of a preform from the mixture and vitrification of the preform by heating at a melting temperature, with an advancing melt front in the preform. Furthermore, the invention concerns an article of opaque porous quartz glass.

In addition, the invention concerns an article of opaque porous quartz glass with an opening enclosed by an inner wall.

Opaque quartz glass is used to manufacture preforms for thermal applications where good heat insulation and high temperature stability are important. Increasing demands are made regarding the purity of such quartz glass preforms. Application examples may include uses in the semiconductor industry where opaque quartz glass is employed for tubes, bells and flanges for diffusion tubes. Opacity is present in low-purity quartz glass due to impurities contained therein. By contrast, with pure quartz glass source materials, opacity of the preform is achieved by pores in the quartz glass. In this context opacity means low transmission (less than a percent) both in the visible (between approx. 350 nm and 800 nm) and the IR spectra (approx. from 750 nm to 4,800 nm). The subject of this invention is the production of opaque quartz glass from pure source materials.

A process of this kind for the production of opaque quartz glass from pure source materials is described in EP A1 816,297. It is proposed there to mix high purity amorphous $SiO_2$ particles of purified natural crystalline quartz granulate or of synthetically produced amorphous $SiO_2$ with pure powdered silicon nitride ($Si_3N_4$), to place the powder mix in a graphite mold lined with graphite felt and to heat it in an electric furnace at between 1,400° C. and 1,900° C., either in a vacuum or in an inert gas atmosphere.

The heating temperature and duration is chosen such that the $SiO_2$ particles are completely melted, forming the article. The lower temperature limit of 1,400° C. mentioned there is given by the melting temperature of the $SiO_2$ particles used, while melting at a temperature above 1,900° C. results in very large bubbles which reduce the mechanical strength of the quartz glass. During the melting, the boundary of the softening and melting quartz glass progresses as the 'melting front' from the graphite mold radially to the interior. At the same time gaseous components such as nitrogen are released due to thermal decomposition of the $Si_3N_4$ powder. The gaseous components form bubbles in the softened quartz glass, producing the desired opacity of the preform.

A preform manufactured according to the known process is composed of opaque glass with a specific density between 1.7 and 2.1 g/cm$^3$, and contains between 3×105 and 5×106 bubbles/cm$^3$ of closed bubbles with a diameter between 10 and 100 mm, with a total bubble surface between 10 and 40 cm$^2$/cm$^3$ and a homogenous bubble distribution.

Devitrification of the opaque quartz glass results in brittleness and reduced resistance to temperature change. In order to avoid this the known process proposes use of high purity source materials. However, contamination of the preform takes place during the manufacturing process as well. In the known process, sources of contamination can be the mold, the graphite felt and the melting atmosphere. In addition, remnants of additives that were not completely, or not at all transformed, can affect the quality of the preform.

The object of the invention is to provide a process for the manufacture of pure opaque quartz glass where the risk of contamination during the manufacturing process is reduced, and an article of pure opaque quartz glass distinguished by high resistance to temperature change, strength and chemical durability.

As concerns the process, the object is achieved on the basis of the process described initially, in that a preform is formed having an inner bore and that the heating takes place in such a way that the melt front advances from the inner bore to the outside.

The preform is formed either from loose fill or from mechanically, chemically or thermally pre-compacted porous mixture of amorphous or crystalline $SiO_2$ particles and an additive. The additive is generally present as a powder or a liquid.

The melt front is an inexact boundary region between melted and partially melted material. Open pores and channels are present in the partially melted material, while closed pores are present in the melted material.

"Melting temperature" means the highest temperature measured during the melting at the wall of the inner bore of the preform.

The preform is heated from the inner bore so that the melt front advances from the inner bore through the wall of the preform to the outside. Shape and location of the inner bore are not decisive for the invention; in the simplest case the inner bore is a central through bore.

According to the invention the melt front advances from the inner wall of the inner bore through the preform to the outside. Sublimable impurities pass into the gas phase. The relevant impurities here are primarily those escaping from the $SiO_2$ particles or from the additive at the melting temperature, or originating in the heat source or the heating atmosphere. The impurities are driven by the melt front to the outside in the direction of the preform regions which are still porous.

The additive is volatile at the melting temperature and releases gases at the melting temperature. The gases are created by transformation (evaporation or decomposition) of the additive and lead—as is intended—to the formation of bubbles in the region of the softened quartz glass. As the melt front advances to the outside the gases reach the boundary region of the preform where they can escape or be suctioned off. Remnants of the additive can impair the devitrification resistance of the opaque quartz glass; however, since the central regions around the inner bore are exposed to the melting temperature the longest, the transformation of the additive there is complete or most advanced. Since the gas being created there is being driven to the outside, the porosity of the melted preform in this region is especially low and increases toward the outside. In this the process according to the invention differs from the known process described initially. In the latter, the melt front advances radially from the outside to the inside so that the contaminants—originating for example from the graphite mold or the graphite felt—preferably accumulate in the central region of the preform where they have in general the most damaging effect, and cannot be removed.

Due to the effect of the melt front advancing from the inside to the outside as described above in more detail, the danger of contamination of the opaque quartz glass is reduced in the manufacturing process according to the invention. The heat source in the inner bore of the preform is surrounded by like material ($SiO_2$ particles) acting simultaneously as the outer thermal insulation of the heat source. Contamination by foreign insulating material is therefore prevented.

It is not necessary, and in view of maintaining as high a purity of the melted preform as possible also generally not desired that the melt front should advance through the entire wall thickness of the preform. A remaining layer of unmelted $SiO_2$ particles facilitates removal of the melted preform from the mold, contributes to the removal of gases during the melting and prevents diffusion of contaminants into the preform from the outside, for example from foreign mold material.

Advantageously, the preform is heated by regions (zones) along a longitudinal axis of the inner bore. This variant of the process permits a particularly high melting temperature. A high melting temperature (for example above 1,900° C.) leads to a complete transformation of the chosen additive. Remnants of the additive in the melted preform are thus avoided. Also, in this variant of the process, additives such as $Si_3N_4$ can be used without problems, as otherwise, at high temperatures such additives tend to produce undesirably large bubbles at the expense of smaller bubbles. This is achieved by heating the preform successively and by region along the inner bore. The heat source is moved continuously, or in small steps relative to the inner wall, along the inner bore (the preform and/or heat source can be moved in a kinetically equivalent setup). The heat source creates in the preform a heated and softened region of low viscosity, hereinafter called the softening zone. The softening zone moves together with the heat source along the inner bore. Due to this constant shifting of the heating zone every region of the preform is exposed to the melting temperature only for a short time so that the softening zone also forms just for a correspondingly brief time period and then cools down immediately. The bubbles created in the softening zone are immediately "frozen" during the cooling. This prevents a growth of bubbles due to low viscosity over a longer time period. Melting of the preform may require multiple back and forth movements of the heat source along the longitudinal axis of the inner bore; however, the melting is preferably accomplished in one pass.

It has been shown to be favorable to rotate the preform along the longitudinal axis of the inner bore. The rotating assures an even heating of the preform and temperature spikes are avoided.

An especially favorable variant has been one where an electric arc was used to heat the preform, the melting temperature having been set to above 1,900° C. The electric arc discharges inside the inner bore of the preform. The mixture of $SiO_2$ particles and an additive is exposed to particularly high temperatures above 1,900° C. when heated by an electric arc. Due to the high temperatures, diffusion and other material exchange processes are accelerated. Contaminants, especially gaseous ones can be effectively removed because they expand and escape to the outside before the melt front. The additive is transformed as completely as possible so that remnants of the additive are avoided. In order to reduce the risk of contamination of the preform even more, electrodes of highly pure materials are available for the electric arc. There is no contact between the electrodes and the wall of the inner bore. When the required purity is particularly high the inner bore is flushed by a gas or the heating atmosphere is evacuated.

The source material used for the process according to the invention ($SiO_2$ particles) is pure or purified granulate of naturally occurring quartz. When the required purity of the opaque quartz glass is particularly high the preferred source material is a granulate produced in a granulating process from synthetic $SiO_2$. It has been shown to be particularly useful to compact porous granulate prior to use. Compacting is accomplished by complete or partial sintering of the porous granulate. The higher density of the granulate reduces accumulation or absorption of contaminants.

An additive is preferably used comprising one or preferably several of the following components: silicon carbide (SiC), aluminum nitride (AlN), silicon nitride ($Si_3N_4$), zirconia ($ZrO_2$), zircon mineral ($ZrSiO_4$), carbon (C), or a substance containing carbon.

Supplementally, but as a preferable alternative, an additive is used containing nano-scale $SiO_2$ powder. Such nano-scale $SiO_2$ powder occurs in known manufacturing processes for synthetic quartz glass, such as in flame hydrolysis or oxidation of inorganic silicon compounds or during sol-gel processing of organic silicon compounds. Such nano-scale $SiO_2$ powders are distinguished by a particularly great surface area ranging up to several hundred $m^2/g$ (BET surface). Surprisingly, it has been shown that such $SiO_2$ powder is suitable as an additive in the context of this invention since during heating it releases gases which result in the desired opacity. The particular advantage of using nano-scale $SiO_2$ powder as an additive is that it is a material of the same kind as the opaque quartz glass, so that introduction of foreign material is avoided.

As far as concerns the article of porous quartz glass, the above-mentioned object is achieved in that the component comprises an opening enclosed by an inner wall and that the inner wall is provided with an inner $SiO_2$ surface layer having a thickness between 30 and 500 mm and a density of at least 2.15 $g/cm^3$.

The article may be for example a hollow cylinder, a container, a flange, a crucible or bell of quartz glass. The article may be designed rotationally symmetrical. The free surface of quartz glass facing the opening of the article shall be called "$SiO_2$ surface layer" or "surface layer" here.

The surface layer is free of pores or is low on pores, having a density of at least 2.15 $g/cm^3$. This density is close to that of transparent quartz glass. Accordingly, the mechanical or chemical properties of the surface layer correspond to those of dense transparent quartz glass. Among other things the surface layer, and therefore the opaque article according to the invention, are distinguished by high mechanical strength and hardness, low abrasiveness, and high chemical durability. The $SiO_2$ surface layer is composed of the same material as the remaining article. This has an advantageous effect on the temperature change stability of the article.

The surface layer of the opaque quartz glass component is produced by forming a starting form from loose fill or from mechanically, thermally or chemically pre-compacted porous amorphous or crystalline $SiO_2$ particles and an additive which is volatile at a melting temperature. The starting form has an inner bore and is heated to the melting point in such a way that a melt front advances from the inner bore to the outside. Further information may be found in the above explanation of the process according to the invention. The preform obtained in this process has an inner opening which was received the highest amount of heat around the inner bore. After melting, this region forms the dense surface called the "surface layer" while the outer regions are porous. A desired opaque quartz glass article may be obtained from the preform by treatment using known methods (flame working, cutting, sawing, drilling).

The article according to the invention is particularly suitable for making containers, muffles, heat shields or pipes where temperature-stable, chemically durable, or dense inner surface of like material is important. In the article according to the invention these functions are handled by the surface layer, and the opaque wall contributes to heat retaining capacity.

The thickness of the surface layer is limited to about 500 mm so that the heat and visible radiation insulating effect remains intact. The minimum thickness of the said surface layer, 30 mm, is necessary to assure the above-mentioned mechanical and chemical properties of the layer and therefore of the article.

A particularly advantageous thickness of the surface layer has been shown to be between 50 and 200 mm.

The invention will be explained in more detail below by way of examples and a drawing. Shown in the drawing are, in FIG. 1, the melting step in the process, exemplified by a hollow cylinder in section, and in FIG. 2, radial cross section through a rotationally symmetrical article according to the invention.

FIG. 1 schematically represents the melting of a hollow cylinder 1, this being the substantive step of the process according to the invention. The production of a hollow cylinder 1 is first explained below by way of two variants:

Variant 1 of the Production of a Hollow Cylinder

Crystalline natural quartz granulate with a grain size from 90 to 315 mm is purified by hot chloration. In a mixer, the purified crystalline quartz granulate is homogeneously mixed with pure Si3N4 powder having an average grain diameter of 0.5 mm, and with 0.01% by weight of Si3N4 powder (relative to the weight of the quartz granulate). The mixture of purified natural quartz granulate and Si3N4 powder is then filled into a tubular metal form 2 rotating about its longitudinal axis 3. The direction of rotation is indicated by arrow 4 in FIG. 1. A rotationally symmetrical hollow cylinder 1 is formed from the fill on the inner wall of the metal form 2 due to the effect of centrifugal forces and the use of a template. The hollow cylinder 1 as fill has a layer thickness of about 100 mm and an inner bore 5 formed as a through bore 6 with an inner diameter of about 110 mm. The fill is easily firmed by centrifugal forces before the execution of the subsequent process step.

Variant 2 of the Production of a Hollow Cylinder

A granulate is manufactured by means of a conventional granulating process from amorphous nano-scale $SiO_2$ particles, the latter having been made by flame hydrolysis of SiCl4. The $SiO_2$ granulate is then compacted at a temperature of about 1,300° C., forming amorphous $SiO_2$ granulate of high purity. The $SiO_2$ granulate, with an average grain diameter of about 250 mm, is homogeneously mixed in a mixer with $Si_3N_4$ powder of high purity and AlN powder of high purity. The proportion of the $Si_3N_4$ powder relative to the weight of the quartz granulate is 0.008% by weight, and that of the AlN powder is 15 ppm by weight (of Al). The mixture of $SiO_2$ powder and the additive substances is then formed in a metal form 2 into a hollow rotationally symmetrical cylinder 1 rotating about the longitudinal axis 3, as described under Variant 1, the cylinder in this case having a fill layer thickness of about 27 mm and an inner bore 5 with an inner diameter of about 110 mm.

Example of the Melting of a Preform

The explanations below relate both to the melting of the hollow cylinder 1 according to Variant 1 as well as Variant 2.

The hollow cylinder 1, mechanically pre-compacted, is melted by regions from the inner bore 6 by means of an electric arc 7. In order to accomplish this, a pair of electrodes 8 is introduced into the inner bore 6 from the one end of the hollow cylinder 1 and is moved continuously to the opposite end of the hollow cylinder 1 and along the inner wall 9. The movement velocity of the electrode pair 8 is 55 mm/min. The hollow cylinder 1 is softened and melted by the heat of the arc 7. A maximum temperature of over 2,100° C. is reached at the inner wall of the hollow cylinder 1. Within the hollow cylinder 1, a melt front 10 is created, said front advancing to the outside in the direction of the metal mold and forming the boundary between an open pore zone 11 and an opaque partially melted zone 12. Directional arrows 14 in FIG. 1 schematically depict the direction of movement 13 of the melt front 10—overlaid by the velocity of the electrode pair 8—substantially directed radially outward from the inner wall 9 of the inner bore 6. The added $Si_3N_4$ powder decomposes due to the high temperature. As a result, gaseous nitrogen is released, creating pores in the opaque zone 12, thus creating the desired opacity of the article. The melt front 10 of the hollow cylinder 1 terminates about 6 cm before the inner wall 5 of the metal mold 2. The remaining granulate layer facilitates removal of the melted hollow cylinder 1 from the metal mold 2 and also serves as heat insulation.

In this process, the region of the inner wall 9 of the inner bore 6 is compacted to a high degree due to the high temperature of the arc 7, providing the melted body 12 with an inner zone 15 composed of high-density transparent quartz glass.

Figure 2:
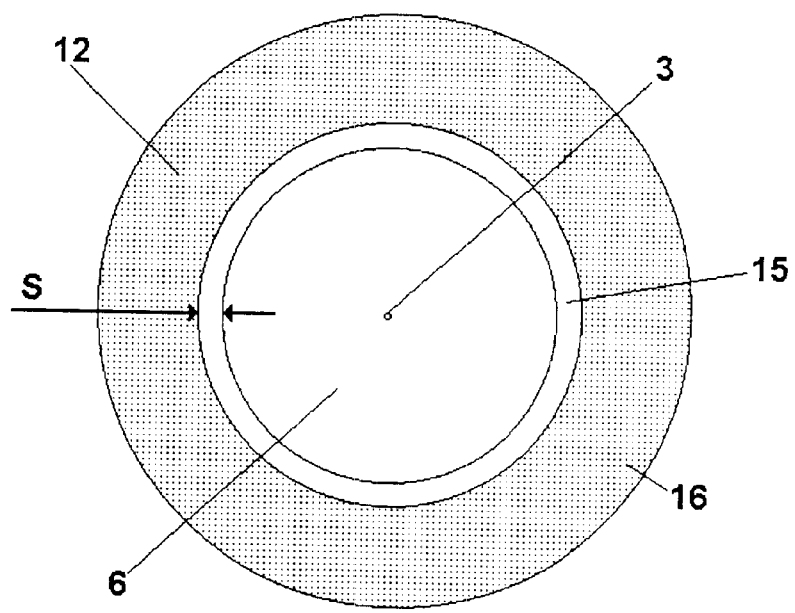

An exemplary article according to the invention with a dense transparent inner zone 15 is explained by way of FIG. 2. To the extent that the same reference numerals are used in FIG. 2 as in FIG. 1 they describe the same or equivalent components of the article according to the invention, as explained in reference to FIG. 1.

Reference numeral 16 is overall assigned to a tubular muffle of high purity opaque quartz glass. The muffle 16 has an inner diameter of 140 mm, outer diameter of 180 mm and a length of about 240 mm. Muffle 16 has an inner zone 15 of transparent quartz glass with a layer thickness "S" of 200 mm. The inner zone 15 is composed of quartz glass with an average density of 2.18 g/cm$^3$ and is integrally joined with the remainder of the body 12 formed by an outer zone of porous opaque quartz glass.

The inner zone 15 is distinguished by high mechanical strength and high chemical durability. Furthermore, the inner zone 15 lends high thermal resistance to the muffle 16 which is particularly important in heat technology applications.

What is claimed is:

1. A process for producing opaque quartz glass, said process comprising:
    providing a mixture comprising $SiO_2$ particles and an additive that is volatile at a melting temperature;
    forming a preform from the mixture, said preform having a radially inward longitudinally extending space therein and an outer surface; and
    vitrifying the preform by heating to at least the melting temperature with an advancing melt front within the preform;
    the heating of the preform causing the melt front to advance from the inward space to the outer surface;
    the heating of the preform being accomplished by an electric arc, and the melting temperature being above 1,900° C.

2. The process according to claim 1, wherein the preform is heated sequentially in a plurality of longitudinally staggered zones of the inner space.

3. The process according to claim 2, wherein the preform is rotated along a longitudinal axis of the space.

4. The process according to claim 1, wherein the $SiO_2$ particles used are a granulate produced in a granulating process from synthetically manufactured $SiO_2$.

5. The process according to claim 4, wherein the granulate is pre-compacted.

6. The process according to claim 1, wherein the additive contains at least one element selected from the group consisting of silicon carbide (SiC), aluminum nitride (AlN), silicon nitride ($Si_3N_4$), zirconia ($ZrO_2$), zircon mineral ($ZrSiO_4$), carbon (C), and a substance containing carbon.

7. The process according to claim 4, wherein the additive contains at least one element selected from the group consisting of silicon carbide (SiC), aluminum nitride (AlN), silicon nitride ($Si_3N_4$), zirconia ($ZrO_2$), zircon mineral ($ZrSiO_4$), carbon (C), and a substance containing carbon.

8. The process according to claim 1, wherein the additive contains nano-scale $SiO_2$ powder.

* * * * *